(12) United States Patent
Vickers

(10) Patent No.: US 9,413,316 B2
(45) Date of Patent: *Aug. 9, 2016

(54) ASYMMETRIC POLYNOMIAL PSYCHOACOUSTIC BASS ENHANCEMENT

(71) Applicant: STMicroelectronics, Inc., Coppell, TX (US)

(72) Inventor: Earl Corban Vickers, San Jose, CA (US)

(73) Assignee: STMicroelectronics, Inc., Coppell, TX (US)

( * ) Notice: Subject to any disclaimer, the term of this patent is extended or adjusted under 35 U.S.C. 154(b) by 276 days.

This patent is subject to a terminal disclaimer.

(21) Appl. No.: 14/107,960

(22) Filed: Dec. 16, 2013

(65) Prior Publication Data

US 2014/0105419 A1    Apr. 17, 2014

Related U.S. Application Data

(63) Continuation of application No. 12/635,548, filed on Dec. 10, 2009, now Pat. No. 8,625,813.

(60) Provisional application No. 61/140,583, filed on Dec. 23, 2008.

(51) Int. Cl.
  *H03G 3/00* (2006.01)
  *H04R 3/04* (2006.01)
  *H04R 5/04* (2006.01)

(52) U.S. Cl.
  CPC .. *H03G 3/00* (2013.01); *H04R 3/04* (2013.01); *H04R 5/04* (2013.01); *H04R 2430/03* (2013.01)

(58) Field of Classification Search
  CPC ........................................ H04R 3/04

USPC ................................ 381/61, 62, 98
See application file for complete search history.

(56) References Cited

U.S. PATENT DOCUMENTS

| | | | |
|---|---|---|---|
| 3,978,287 A | 8/1976 | Fletcher et al. | |
| 6,111,960 A * | 8/2000 | Aarts | H04R 3/00 381/61 |
| 6,522,493 B1 * | 2/2003 | Dobbek | G11B 5/59627 360/75 |
| 6,911,925 B1 * | 6/2005 | Slavin | H03M 1/0614 341/117 |
| 7,907,664 B2 | 3/2011 | Song et al. | |
| 7,999,587 B2 | 8/2011 | Vromans et al. | |
| 2005/0120870 A1 | 6/2005 | Ludwig | |
| 2006/0159283 A1 | 7/2006 | Mathew et al. | |
| 2008/0175409 A1 * | 7/2008 | Lee | H04R 3/04 381/98 |

OTHER PUBLICATIONS

Nay OO, Woon-Seng Gan, "Harmonic Analysis of Nonlinear Devices for Virtual Bass System", Digital Signal Processing Lab, School of EEE, Nanyang Technological University, Singapore, ICALIP 2008, pp. 279-284.

(Continued)

*Primary Examiner* — Alexander Jamal
(74) *Attorney, Agent, or Firm* — Gardere Wynne Sewell LLP

(57) ABSTRACT

Psychoacoustic bass audio signal enhancement can be accomplished using a monotonic, asymmetric polynomial distortion. A non-linear process applies a monotonic, asymmetric polynomial distortion function that has continuous first and second derivatives to generate even and odd harmonics of missing fundamental frequencies. This polynomial distortion produces the desired psychoacoustic effect with a fairly rapid rolloff so as to avoid unpleasant aliasing. Moreover, the lack of first-order discontinuities prevents clicks or glitches.

19 Claims, 7 Drawing Sheets

(56) References Cited

OTHER PUBLICATIONS

Nay OO, Woon-Seng Gan, "Analytical and Perceptual Evaluation of Nonlinear Devices for Virtual Bass System," School of EEE, Nanyang Technological University, Singapore, Audio Engineering Society Convention Paper 8108, Presented at the 128th Convention, May 22-25, 2010, London, UK.

* cited by examiner

ASYMMETRIC POLYNOMIAL PSYCHOACOUSTIC BASS ENHANCEMENT

RELATED APPLICATIONS

The present application is a continuation of and claims the benefit of priority to U.S. Non-Provisional patent application Ser. No. 12/635,548 filed Dec. 10, 2009, and Provisional Patent Application No. 61/140,583 filed Dec. 23, 2008, which are hereby incorporated by reference in their entireties for all purposes as if fully set forth herein.

BACKGROUND OF THE INVENTION

1. Field of the Invention

Embodiments of the present invention relate, in general, to psychoacoustic bass enhancement and more particularly to psychoacoustic bass enhancement using asymmetric polynomial distortion.

2. Relevant Background

Due to limitations imposed by size, power and cost, the speakers used in televisions, personal computers, notebooks, portable devices etc., often have poor response at the lower part of their frequency range and as a result their reproduction of bass sounds is poor. For example, television manufacturers often cut costs and save space by using small, inexpensive speakers with poor low-frequency response. FIG. 1 shows a typical amplitude response of a small speaker. As shown in FIG. 1, small speakers often do a poor job of reproducing signals with frequency lower than 100 or 150 Hz, called "deep bass" signals. The frequency response 110 of the speaker output has extreme attenuation at the deep bass frequencies 120. The inability of the speakers to reproduce bass content in an audio signal drastically diminishes the auditory experience of the listener, and brute-force attempts to amplify the bass level can result in loudspeaker overload and unpleasant distortion.

Because such speakers are very inefficient at low frequencies, attempts to increase the bass volume by amplifying the low frequencies can result in high cone excursion, which may overload the speakers and cause unpleasant (raspy or rattling) distortion. Therefore, other ways for improving the sound quality have been considered.

One means to enhance the bass content is by making use of psychoacoustic properties of the human hearing system. Psychoacoustic bass enhancement produces deep bass signals by non-linearly processing the audio signal. The bass frequency reproduction capability of limited frequency range speakers is improved by preprocessing the audio signal to generate harmonics of the fundamental bass tones.

Psychoacoustic studies have shown that, when subjects listen to only the harmonics of a bass signal, they perceive the fundamental frequency, even though the fundamental frequency is missing. This "missing fundamental effect" is exploited to create an auditory experience of hearing deep bass content using speakers that lack the ability to produce deep bass.

One psychoacoustic technique known in the art is to use a set of filters to derive the deep bass signal and to bandlimit the non-linearly processed deep bass signal, as shown in FIG. 2. In FIG. 2, the left input 210 and right input 220 are summed 225 and sent to first bandpass filter 235, thus extracting a bass signal, x(t), while rejecting sub-audio signals. The left input 210 and the right input 220 independently pass through a high pass filter 230. A non-linear distortion 240 is applied to the bass signal, generating a non-linearly processed bass signal, ŷ(t), containing harmonics of the fundamental frequency. The non-linearly processed bass signal is sent to a second bandpass filter 260, scaled by the Gain 265 and added 225 to the highpass filtered 230 left and right inputs 210, 220 to produce left and right outputs 250, 260. A variety of similar structures can be used instead.

Since low frequencies cannot be reproduced effectively by the speakers, it is desirable to apply non-linear processing to create harmonics that will give the illusion of the missing fundamental. A variety of non-linear processing methods have been used in the past with limited success, such as "harmonics generation by multiplication," rectification, and integration (involving integrating a rectified input signal and resetting the output to zero after alternate zero crossing).

The rectification method only produces even harmonics, which causes an undesirable doubling of the perceived pitch; it also produces a great deal of undesired intermodulation distortion. The integration method has poor temporal characteristics, with a slow attack and decay. And the "harmonics generation by multiplication" method can only produce a fixed, finite number of harmonics, and it produces a variable amount of intermodulation distortion, depending on the harmonic number.

A challenge therefore remains to provide a non-linear process supportive of psychoacoustic bass enhancement to create even and odd harmonics that provide a realistic illusion of missing fundamental frequencies without the deficiencies and inadequacies of techniques currently known in the prior art. These and other challenges of the prior art are addressed by one or more embodiments of the present invention.

SUMMARY OF THE INVENTION

Psychoacoustic bass enhancement using normalized asymmetric polynomial distortion is hereafter described by way of example. A non-linear process applies an asymmetric polynomial distortion function that has continuous first and second derivatives to generate even and odd harmonics of missing fundamental frequencies. This polynomial distortion produces the desired psychoacoustic effect with a fairly rapid rolloff so as to avoid unpleasant aliasing. Moreover, the lack of first-order discontinuities prevents clicks or glitches.

The features and advantages described in this disclosure and in the following detailed description are not all-inclusive. Many additional features and advantages will be apparent to one of ordinary skill in the relevant art in view of the drawings, specification, and claims hereof. Moreover, it should be noted that the language used in the specification has been principally selected for readability and instructional purposes and may not have been selected to delineate or circumscribe the inventive subject matter; reference to the claims is necessary to determine such inventive subject matter.

BRIEF DESCRIPTION OF THE DRAWINGS

The aforementioned and other features and objects of the present invention and the manner of attaining them will become more apparent, and the invention itself will be best understood, by reference to the following description of one or more embodiments taken in conjunction with the accompanying drawings, wherein.

Figure 1:
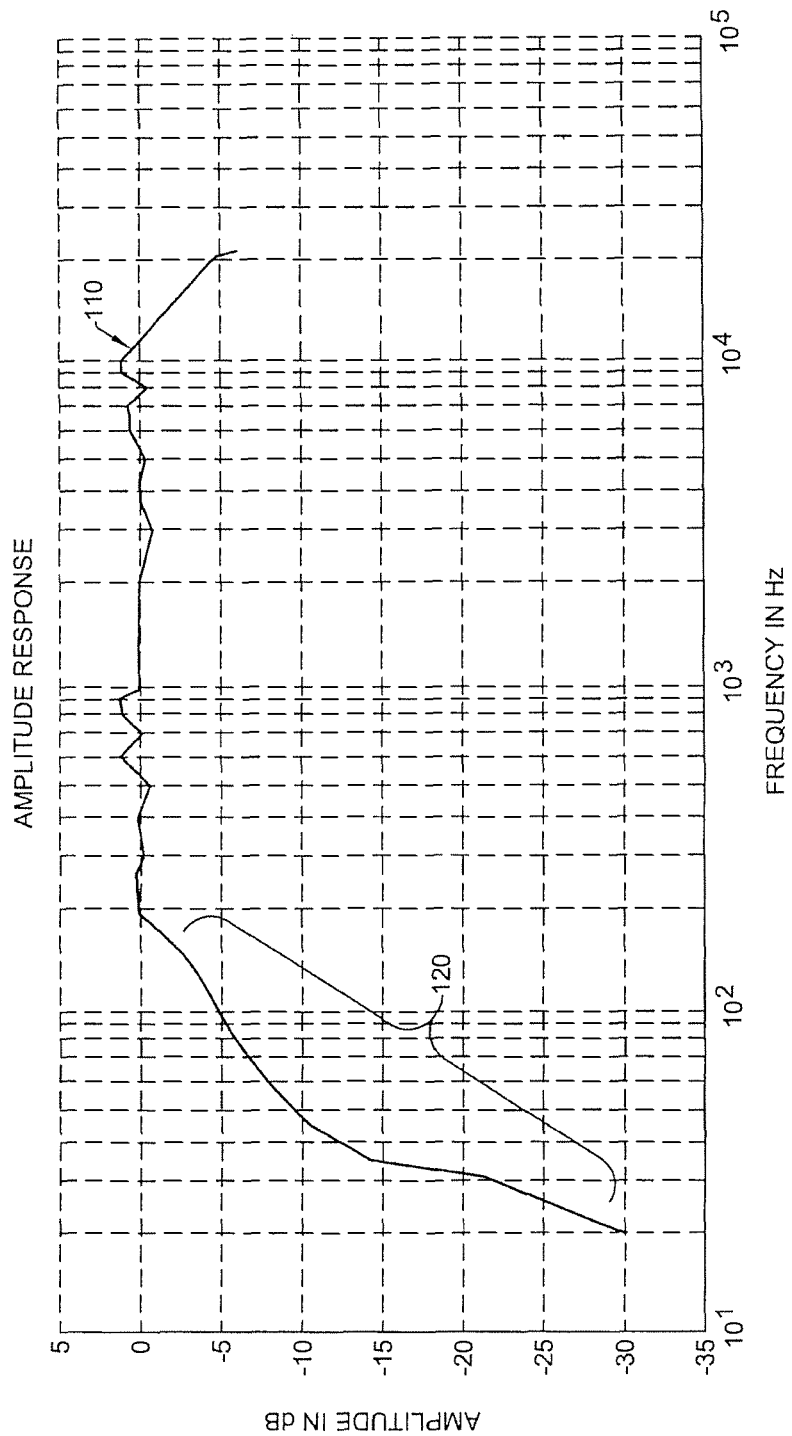
FIG. 1 shows the typical amplitude response of a small speaker over a frequency range of $10^1$ Hz to $10^5$ Hz, as would be known in the prior art.
Figure 2:
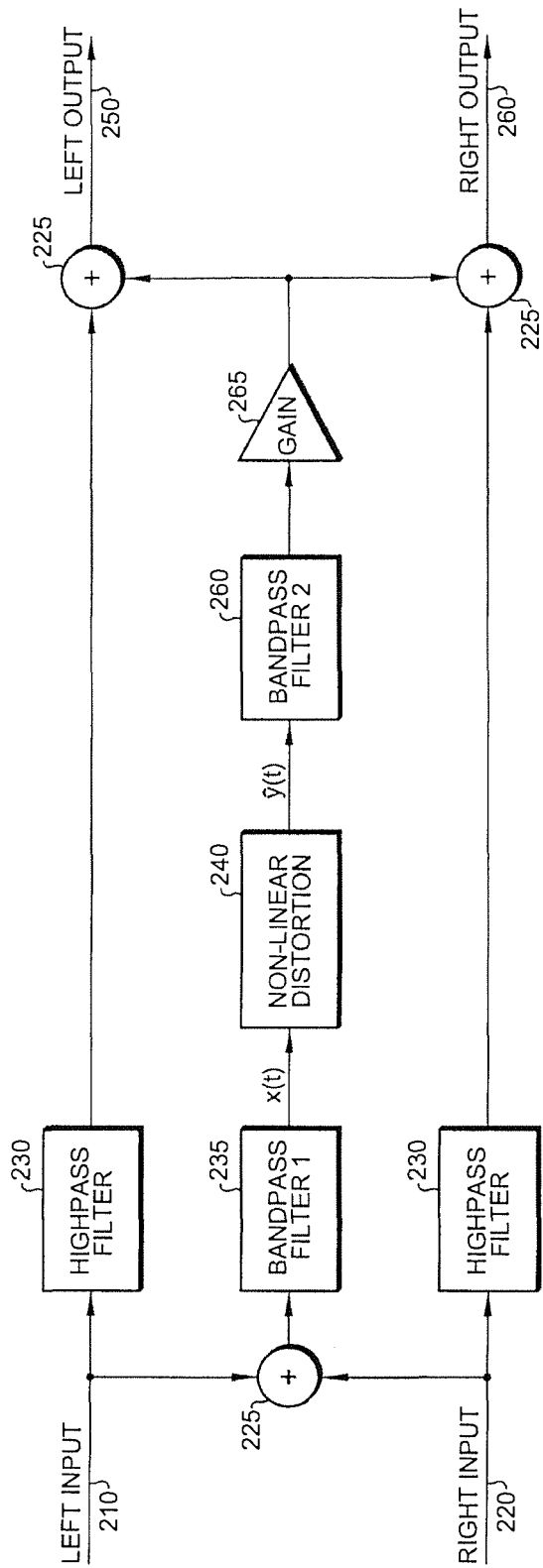
FIG. 2 shows a high-level block diagram of a typical circuit implementing psychoacoustic non-linear bass enhancement, as is known in the prior art.

The Figures depict embodiments of the present invention for purposes of illustration only. One skilled in the art will readily recognize from the following discussion that alternative embodiments of the structures and methods illustrated herein may be employed without departing from the principles of the invention described herein.

GLOSSARY

As a convenience in describing the invention herein, the following glossary of terms is provided. Because of the introductory and summary nature of this glossary, these terms must also be interpreted more precisely by the context of the Detailed Description in which they are discussed.

Pitch—pitch in this context is defined as that attribute of auditory sensation in terms of which sounds may be ordered on a musical scale.

Loudness—this is an intensive attribute of an auditory sensation in terms of which sounds may be ordered on a scale extending from quiet to loud.

Loudness level—the loudness level, of a sound, in phons, is the sound pressure level (SPL) in dB of a pure tone of frequency 1 kHz which is judged by the listener to be equivalent in loudness—this is a sensory measure.

Timbre—timbre is that attribute of auditory sensation in terms of which a listener can judge that two sounds similarly presented and having the same loudness and pitch are dissimilar. Put more simply it is related to the quality of a sound.

Psychoacoustic—psychoacoustic concerns the subjective manner in which the listener senses sounds. The sensation is contingent upon many physiological factors such as the characteristics of the membrane in the ear, the firing rate of the neurons in the brain that are governed by respective frequencies of the sensed sound, and other factors, as known per se. Three main attributes of psychoacoustic sensation that are relevant to the present invention are loudness, pitch and timbre.

Low frequency psychoacoustic sensation (LFPS)—the psychoacoustic sensation that stems from the low frequency range of a sound signal, assuming that essentially no physical and electro-acoustic limitations prevail.

Pseudo low frequency psychoacoustic sensation (Pseudo-LFPS)—a psychoacoustic sensation that stems from frequencies other than the low frequency range of the original sound signal and which attempts to resemble the low frequency psychoacoustic sensation.

Residue pitch effect (referred to also as the phenomenon of the missing fundamental)—generally speaking, the residue pitch effect is a psychoacoustic effect by which sensation of low pitch is accomplished by incorporating harmonics of the fundamental (low) frequencies in the sound while removing the fundamental frequency itself. The residue pitch effect conveys to the listener the psychoacoustic sensation of a low pitch without having to physically transmit low frequencies acoustically. The residue pitch effect which is referred to also as the "phenomenon of the missing fundamental" is exemplified with reference to a high range of the bass frequency's range, i.e. 200 Hz.

Bass frequency range—a frequency range of substantially 20-300 Hz.

Low frequency range of interest—a range of frequencies that is subject to the Pseudo-LFPS. The specified range may be wholly contained in said Bass frequency range, or partially overlapping said Bass frequency range. The low frequency range of interest may extend over one, or if desired two or more distinct sub-ranges, including discrete frequencies. Each frequency in said low frequency range of interest is regarded as a fundamental frequency.

DESCRIPTION OF THE INVENTION

A bass signal is psychoacoustically enhanced by using an asymmetric polynomial distortion function. The asymmetric polynomial distortion function of the present invention optimizes psychoacoustic bass signal enhancement so as produce a more pleasant tone and timbre and rapid roll off to minimize aliasing. Moreover the output amplitude of the signal can be limited without affecting the quality of the tone so as to minimize the possibility of speaker overload.

Embodiments of the present invention are hereafter described in detail with reference to the accompanying Figures. Although the invention has been described and illustrated with a certain degree of particularity, it is understood that the present disclosure has been made only by way of example and that numerous changes in the combination and arrangement of parts can be resorted to by those skilled in the art without departing from the spirit and scope of the invention.

Included in the description are flowcharts depicting examples of the methodology which may be used for psychoacoustic bass enhancement using an asymmetric polynomial distortion function. In the following description, it will be understood that each block of the flowchart illustrations, and combinations of blocks in the flowchart illustrations, can be implemented by computer program instructions. These computer program instructions may be loaded onto a computer or other programmable apparatus to produce a machine such that the instructions that execute on the computer or other programmable apparatus create means for implementing the functions specified in the flowchart block or blocks. These computer program instructions may also be stored in a computer-readable memory that can direct a computer or other programmable apparatus to function in a particular manner such that the instructions stored in the computer-readable memory produce an article of manufacture including instruction means that implement the function specified in the flowchart block or blocks. The computer program instructions may also be loaded onto a computer or other programmable apparatus to cause a series of operational steps to be performed in the computer or on the other programmable apparatus to produce a computer implemented process such that the instructions that execute on the computer or other programmable apparatus provide steps for implementing the functions specified in the flowchart block or blocks.

Accordingly, blocks of the flowchart illustrations support combinations of means for performing the specified functions and combinations of steps for performing the specified functions. It will also be understood that each block of the flowchart illustrations, and combinations of blocks in the flowchart illustrations, can be implemented by special purpose hardware-based computer systems that perform the specified functions or steps, or combinations of special purpose hardware and computer instructions.

Figure 3:
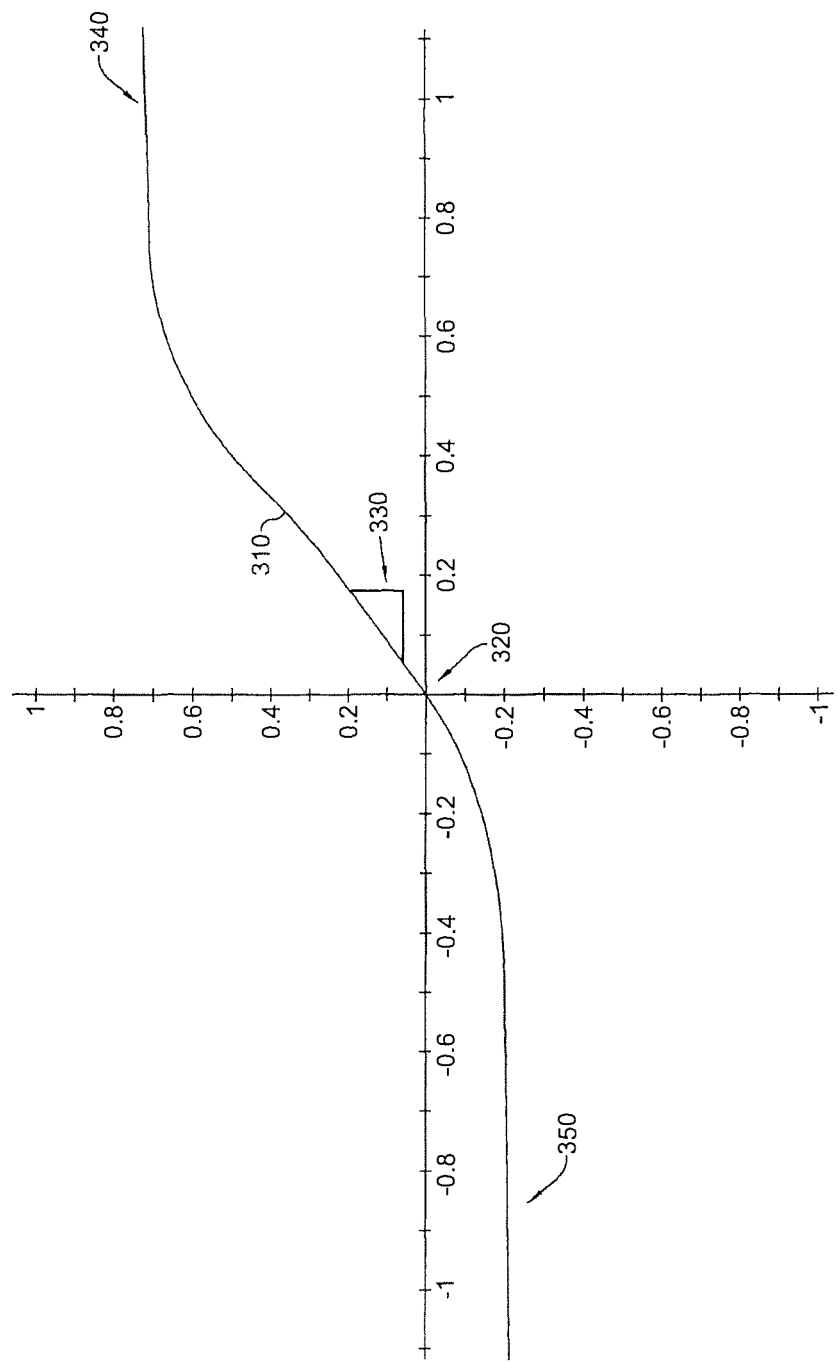
FIG. 3 is a graphical presentation of an asymmetric polynomial distortion function for producing psychoacoustic bass enhancement, according to one embodiment of the present invention.

The non-linear psychoacoustic bass signal enhancement process of the present invention applies an asymmetric polynomial distortion function, as shown in FIG. 3, that has continuous first and second derivatives. This distortion creates even and odd harmonics, as needed to produce the desired psychoacoustic effect, but with a fairly rapid rolloff to avoid unpleasant aliasing. The lack of first-order discontinuities also prevents clicks or glitches.

Unlike some other methods of harmonic generation, the distortion function of the present invention automatically performs "soft-clipping," that is to say, limiting the output amplitude and thereby minimizing the possibility of loudspeaker overload. Furthermore, the present invention cancels a portion of the energy at the fundamental frequency which helps prevent loudspeaker overload. The "tube-like" distortion as a result of the present invention reduces inharmonicity and produces a more pleasant, less harsh sound with a resulting timbre that is more "musical" and more similar to the original bass timbre.

FIG. 3 is a graphical representation of an asymmetric polynomial distortion function for producing psychoacoustic bass enhancement according to one embodiment of the present invention. To achieve the desired effects the asymmetric polynomial distortion function of the present invention is constrained to have continuous first and second derivatives and create even and odd harmonics. The distortion function of the present invention provides a nearly linear response 330 for small signals near the origin 320 and highly distorted or clipped response for high signals 340, 350.

The asymmetric polynomial distortion function of the present invention is, according to one embodiment, created using a pair of $4^{th}$-order polynomials; one polynomial for positive input samples, and the other for negative inputs. The following description outlines the derivation and implementation of the asymmetric polynomial distortion function of the present invention.

As will be recognized by one of ordinary skill in the relevant art, the input values as a function of time may be denoted by $x(t)$; the output values may be denoted by $y(t)=f(x(t))$, where $f$ is the desired distortion function. For simplicity of notation, the following description of the present invention omits the time variable t from the following equations.

According to one embodiment of the present invention, when $-1<x<1$, the asymmetric distortion function $f(x)$ will take the following form:

$$f(x) = \begin{cases} a_p x^4 + b_p x^3 + c_p x^2 + d_p x + e_p, & 0 \le x < 1 \\ a_n x^4 + b_n x^3 + c_n x^2 + d_n x + e_n, & -1 < x < 0 \end{cases}$$

where the output $f(x)$ varies instantaneously as a function of the input value x.

In many systems, the magnitude of the input will be limited to ±1.0; however, if the magnitude of the input is greater than or equal to 1.0, the output will be clipped to the positive and negative soft-clipping levels $k_p$ and $k_n$ as follows:

$$f(x) = \begin{cases} k_p, & x \ge 1 \\ k_n, & x \le -1 \end{cases}$$

Each of the coefficients $k_p, k_n, a_p, b_p, c_p, d_p, e_p, a_n, b_n, c_n, d_n,$ and $e_n$ are constrained as follows.

According to one embodiment, the asymmetric polynomial distortion function of the present invention transitions smoothly from a nearly linear response at low signal levels to a highly-distorted (nearly clipped) response at high signal levels. To obtain a nearly linear response at low levels, the function is constrained to pass through the origin:

$f(0)=0$

In addition, to obtain a nearly linear response at low levels, the slope at the origin is constrained to be unity:

$f'(0)=1$

The output of the asymmetric polynomial distortion function is further constrained to increase monotonically as the input increases from −1.0 to +1.0:

$f(x+\epsilon)>f(x)$, $-1.0<x<1.0$, where $\epsilon$ is a small positive number.

In order to limit loudspeaker cone excursions and minimize the possibility of speaker overload, the output voltage should be less than the input voltage. Accordingly parameters $k_p$ and $k_n$ are obtained such that $0<k_p<1$, and $-1<k_n<0$, where $k_p$ and $k_n$ are the positive and negative soft-clipping output levels when the inputs are +1 and −1, respectively: $f(1)=k_p$, and $f(-1)=k_n$. Since the distortion curve is monotonic, $k_p$ and $k_n$ represent limiting positive and limiting negative output values, respectively.

If the distortion curve were symmetrical, only odd harmonics would be produced. According to another aspect of the present invention, to produce both odd and even harmonics, the positive and negative soft-clipping levels $k_p$ and $k_n$ are constrained to have unequal magnitudes: $|k_p| \ne |k_n|$. In order to produce maximum distortion (full clipping) at the maximum input levels, the slope of the distortion function is constrained to become zero (horizontal) at x=±1.0:

$$f'(1) = 0,$$

$$f'(-1) = 0..$$

In order to ensure that the levels of the harmonics roll off fairly rapidly, thus producing a smooth sound and avoiding aliasing of high harmonics, the second derivative of the distortion function is directed to be zero when the input is ±1.0:

$$f''(1) = 0,$$

$$f''(-1) = 0.$$

and to be continuous at x=0: $f''(0-\epsilon)=f''(0+\epsilon)$.

To satisfy each of the above-identified constraints without providing unnecessary degrees of freedom or violating the monotonicity requirement, $4^{th}$-order polynomials are chosen according to one embodiment of the present invention. Each of the coefficients $k_p, k_n, a_p, b_p, c_p, d_p, e_p a_n, b_n, c_n, d_n,$ and $e_n$ that satisfy these constraints can be derived as follows:

Begin by selecting a negative soft-clipping output level $k_n$, such that $-0.75 \le k_n \le -0.25$. For negative input values $-1<x \le 0$, the "negative" distortion polynomial is $f(x)=a_n x^4 + b_n x^3 + c_n x^2 + d_n x + e_n.$ Recall that $f(0)$ is constrained to equal 0; therefore, $e_n=0$, which simplifies the polynomial to $f(x)=a_n x^4+b_n x^3+c_n x^2+d_n x$.

Similarly, slope $f'(0)$ is constrained to equal 1. The derivative of the simplified "negative" polynomial is $f'(x)=4a_n x^3+3b_n x^2+2c_n x+d_n$. Setting x to 0 and $f'(x)$ to 1, results in: $d_n=1$. The asymmetric polynomial distortion function now simplifies to $$f(x)=a_n x^4+b_n x^3+c_n x^2+x$$

Constraining $f(-1)=k_n$ with $x=-1$ yields $k_n+1=a_n-b_n+c_n$ and constraining $f'(-1)=0$ with $x=-1$ yields $-1=-4a_n+3b_n-2c_n$.

Knowing that $f''(-1)=0$ combined with the second derivative being $f''(x)=12a_n x^2+6b_n x+2c_n$ yields $0=12a_n-6b_n+2c_n$ when x is set equal to $-1$.

As a result three equations are derived with three unknowns, as follows:

$$\begin{bmatrix} k_n+1 \\ -1 \\ 0 \end{bmatrix} = \begin{bmatrix} 1 & -1 & 1 \\ -4 & 3 & -2 \\ 12 & -6 & 2 \end{bmatrix} \begin{bmatrix} a_n \\ b_n \\ c_n \end{bmatrix}.$$

These equations can be solved via elimination yielding:

$c_n=6k_n+3$, $b_n=8k_n+3$, and $a_n=3k_n+1$.

Next, the coefficients of the "positive" distortion polynomial are obtained. For positive input values $0 \leq x < 1$, the polynomial is $f(x)=a_p x^3+b_p x^3+c_p x^2+d_p x+e_p$. According to the constraint, $f(0)=0$; it follows that $e_p=0$ and the polynomial simplifies to $$f(x)=a_p x^4+b_p x^3+c_p x^2+d_p x.$$

Applying the constraint $f'(0)=1$ to the simplified "positive" polynomial $f'(x)=4a_p x^3+3b_p x^2+2c_p x+d_p$ and setting x to 0 and $f'(x)$ to 1, results in $d_p=1$.

The asymmetric polynomial distortion function therefore simplifies to $$f(x)=a_p x^4+b_p x^3+c_p x^2+x.$$

Recall that $f(1)$ is constrained to equal $k_p$. Setting $x=1$ yields $k_p-1=a_p+b_p+c_p$ and applying constraint $f'(1)=0$ yields $-1=4a_p+3b_p+2c_p$.

When the constraint $f''(-1)=0$ is applied with $x=1$, $0=12a_p+6b_p+2c_p$ results.

Recall that the second derivative of the two polynomials are each constrained to be equal at $x=0$. Substituting the value of coefficient $c_n=6k_n+3$ and setting $x=0$ the second derivative of the "negative" polynomial at $x=0$ is $f''(0)=12k_n+6$.

The second derivative of the "positive" polynomial yields the same value when $x=0$. Therefore, $f''(0)=2c_p=12k_n+6$, with $c_p=6k_n+3$.

Combining the results gives three equations in three unknowns, as follows $$\begin{bmatrix} k_p-1 \\ -1 \\ 0 \end{bmatrix} = \begin{bmatrix} 1 & 1 & 1 \\ 4 & 3 & 2 \\ 12 & 6 & 2 \end{bmatrix} \begin{bmatrix} a_p \\ b_p \\ c_p \end{bmatrix}.$$

Substituting $c_p 6k_n=+3$ and rearranging yields:

$$\begin{bmatrix} -6k_n-4 \\ -12k_n-7 \\ -12k_n-6 \end{bmatrix} = \begin{bmatrix} 1 & 1 & -1 \\ 4 & 3 & 0 \\ 12 & 6 & 0 \end{bmatrix} \begin{bmatrix} a_p \\ b_p \\ k_p \end{bmatrix}.$$

These equations are thereafter solved via elimination, as follows:

$$\begin{bmatrix} -6k_n-4 \\ 12k_n+9 \\ 60k_n+42 \end{bmatrix} = \begin{bmatrix} 1 & 1 & -1 \\ 0 & -1 & 4 \\ 0 & -6 & 12 \end{bmatrix} \begin{bmatrix} a_p \\ b_p \\ k_p \end{bmatrix},$$

and $$\begin{bmatrix} -6k_n-4 \\ 12k_n+9 \\ -12k_n-12 \end{bmatrix} = \begin{bmatrix} 1 & 1 & -1 \\ 0 & -1 & 4 \\ 0 & 0 & -12 \end{bmatrix} \begin{bmatrix} a_p \\ b_p \\ k_p \end{bmatrix}.$$

Using back substitution, we obtain:

$k_p=k_n+1$, $b_p=-8k_n-5$, and $a_p=3k_n+2$.

Summarizing the above equations, we have:

$$f(x) = \begin{cases} k_p, & x \geq 1 \\ a_p x^4+b_p x^3+c_p x^2+x, & 0 \leq x < 1 \\ a_n x^4+b_n x^3+c_n x^2+x, & -1 < x < 0 \\ k_n, & x \leq -1 \end{cases},$$

where $k_n$ is arbitrarily selected within the limits $-0.75 \leq k_n \leq -0.25$, and $a_n=3k_n+1$, $b_n=8k_n+3$, $c_n=6k_n+3$, $a_p=3k_n+2$, $b_p=-8k_n-5$, $c_p=6k_n+3$, $k_p=k_n+1$, and $k_p \neq -k_n$.

If, for example, $k_n$, is set to $-0.25$, the following coefficients are obtained:

$a_p=1.25$
$b_p=-3$
$c_p=1.5$ $a_n=0.25$
$b_n=1$
$c_n=1.5$
$k_p=0.75$ resulting in the following distortion function:

$$f(x) = \begin{cases} 0.75, & x \geq 1 \\ 1.25x^4 - 3x^3 + 1.5x^2 + x, & 0 \leq x < 1 \\ 0.25x^4 + x^3 + 1.5x^2 + x, & -1 < x < 0 \\ -0.25, & x \leq -1 \end{cases}.$$

which is represented in FIG. 3 by curve 310.

According to one embodiment of the present invention, when the negative soft-clipping output level $k_n$ exceeds the range $-0.75 \leq k_n \leq -0.25$, the distortion function will no longer increase monotonically and will therefore violate one of the above mentioned constraints. Specifically, the "positive" polynomial will violate monotonicity when $k_n < -0.75$, and the "negative" polynomial will violate monotonicity when $k_n > -0.25$.

The value of x at which the polynomial becomes non-monotonic can be determined by setting the $2^{nd}$ derivative to 0; then the limit value of $k_n$ can be determined by setting x to $\pm 1.0$, so that x is monotonic within the range $-1 \leq x \leq 1$. Setting the $2^{nd}$ derivative of the "positive" polynomial to 0 and solving the quadratic equation yields two results:

$$x = \frac{4k_n + 2}{12k_n + 8}.$$

and a trivial case of $$x = \frac{12k_n + 8}{12k_n + 8} = 1.$$

Setting x=1 in the non-trivial result yields the minimum value of $k_n$ for the "positive" polynomial:

$k_n = -0.75$.

Likewise, setting the $2^{nd}$ derivative of the "negative" polynomial to 0 and solving the quadratic equation yields two results:

$$x = \frac{-4k_n - 2}{12k_n + 4},$$

and a trivial case of $$x = \frac{-12k_n - 4}{12k_n + 4} = -1.$$

Setting x=−1 in the non-trivial result yields the maximum value of $k_n$ for the "negative" polynomial:

$k_n = -0.25$.

It can be demonstrated empirically that the distortion function is monotonic when $k_n$ is within the range $-0.75 \leq k_n \leq -0.25$.

According to one embodiment of the present invention the signal is normalized prior to applying the asymmetric polynomial distortion function according to a smoothed peak level. By accomplishing this normalization, approximately the same harmonic content is generated by loud notes as by soft and decaying notes. Otherwise, soft bass notes might be inaudible, because their amplitudes would be in the approximately-linear range of the distortion function; as a result, no significant harmonics would be generated. Moreover, if the normalization was not accomplished, decaying musical notes could become inaudible because the later portions of the decay would be in the approximately-linear range of the distortion function and no significant harmonics would be generated.

The smoothed peak level, which is used in the normalization process to derive a normalization factor, can be determined by a peak detector circuit. A variety of peak detector circuit designs are well known to one skilled in the prior art and their use is equally compatible with the concepts of the present invention presented herein.

After applying the non-linear distortion of the present invention, the normalization is compensated by multiplying by the inverse of the normalization factor (smoothed peak value). If the inverse operation is computationally expensive, the inverse operation can be down-sampled to reduce the cost.

In practice, scaling problems may be encountered in fixed-point processing if the input is divided by the smoothed peak level r (normalization factor), the asymmetric polynomial distortion algorithm is performed, and the result is multiplied by the smoothed peak level, especially if the smoothed peak level is very small. As a result, the equations should be re-factored to eliminate the need to multiply by the smoothed peak level, as follows:

$$f(x) = \begin{cases} k_p r, & x \geq r \\ a_p\left(\frac{x}{r}\right)^4 + b_p\left(\frac{x}{r}\right)^3 + c_p\left(\frac{x}{r}\right)^2 + \frac{x}{r}, & 0 \leq x < r \\ a_n\left(\frac{x}{r}\right)^4 + b_n\left(\frac{x}{r}\right)^3 + c_n\left(\frac{x}{r}\right)^2 + \frac{x}{r}, & -r < x < 0 \\ k_n r, & x \leq -r \end{cases}.$$

This simplifies to:

$x_p = \frac{x}{r}$ $x_{2p} = x \cdot x_p$ $x_{3p2} = x_{2p} \cdot x_p$ $x_{4p3} = x_{3p2} \cdot x_p$ $$f(x) = \begin{cases} k_p r, & x \geq r \\ a_p x_{4p3} + b_p x_{3p2} + c_p x_{2p} + x, & 0 \leq x < r \\ a_n x_{4p3} + b_n x_{3p2} + c_n x_{2p} + x, & -r < x < 0 \\ k_n r, & x \leq -r \end{cases}.$$

Figure 4:
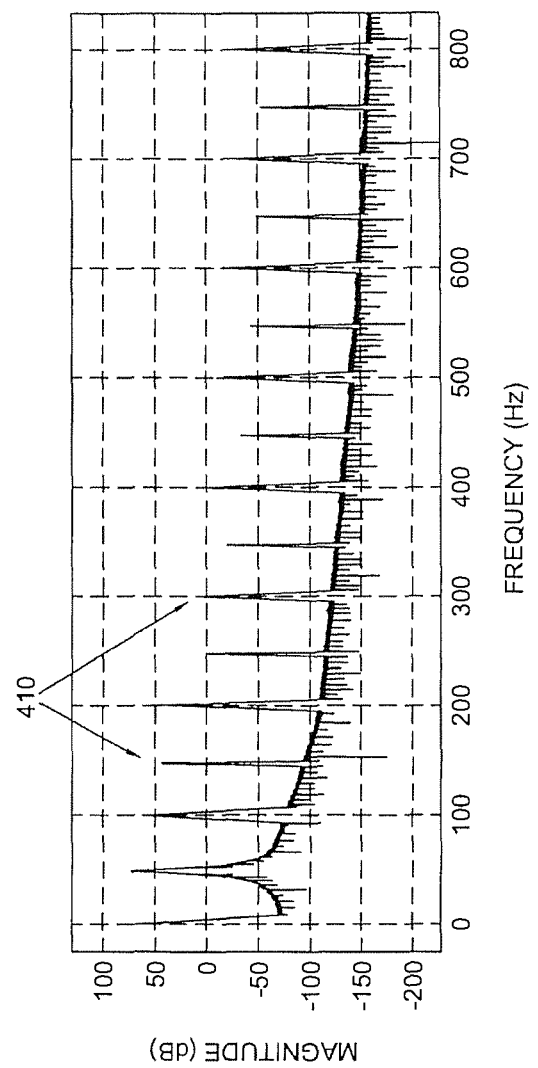
FIG. 4 is a depiction of a magnitude response spectrum of an asymmetric polynomial distortion function bass signal enhancement of the present invention in response to a 50 Hz sinusoidal input.
Figure 5:
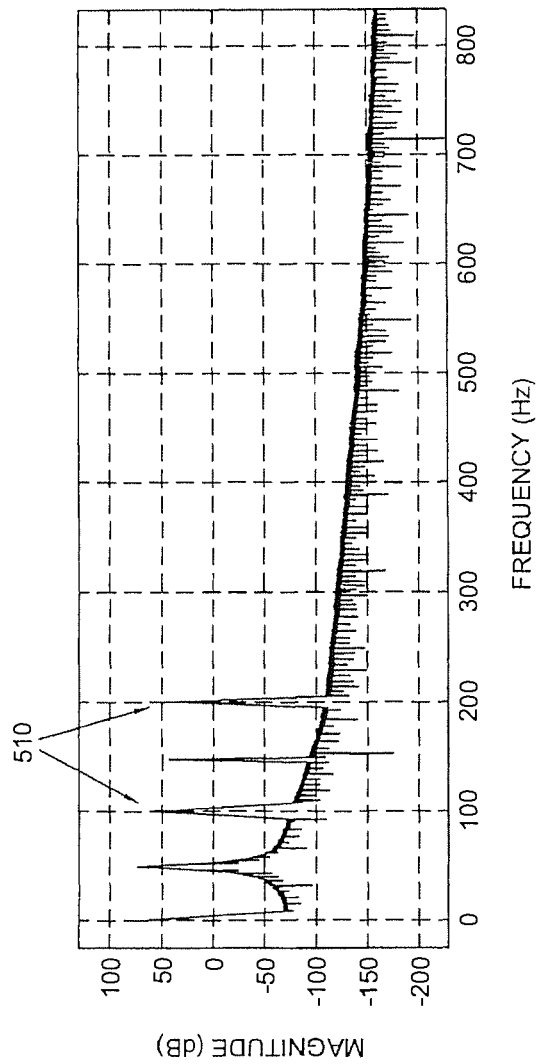
FIG. 5 is a depiction of a magnitude response spectrum of a multiplication bass signal enhancement of the prior art "harmonies generation by multiplication" method in response to a 50 Hz sinusoidal input.

FIG. 4 is a representative depiction of a magnitude spectrum produced by an asymmetric polynomial distortion function of the present invention. The output of FIG. 4 is in response to a 50 Hz sinusoidal input. The harmonics shown in FIG. 4 are in comparison to those produced by a simple multiplication method as shown in FIG. 5. As can be seen, the harmonics 410 produced by the present invention vastly out number the harmonics produced 510 by the multiplication method. While all of a harmonic production comparison is not presented for each method known in the art, the increased production of harmonics by the asymmetric polynomial distortion function of the present invention is consistent and a characteristic of the present invention. After the non-linear processing, some of the higher harmonics are typically filtered out by a bandpass filter but some of the intermediate harmonics ($5^{th}$, $6^{th}$, etc.) remain and are useful in producing a more convincing psychoacoustic effect and more musical timbre.

To minimize speaker overload, a portion of the input signal is subtracted from the result in order to remove some or most of the remaining fundamental frequency.

Figure 6:
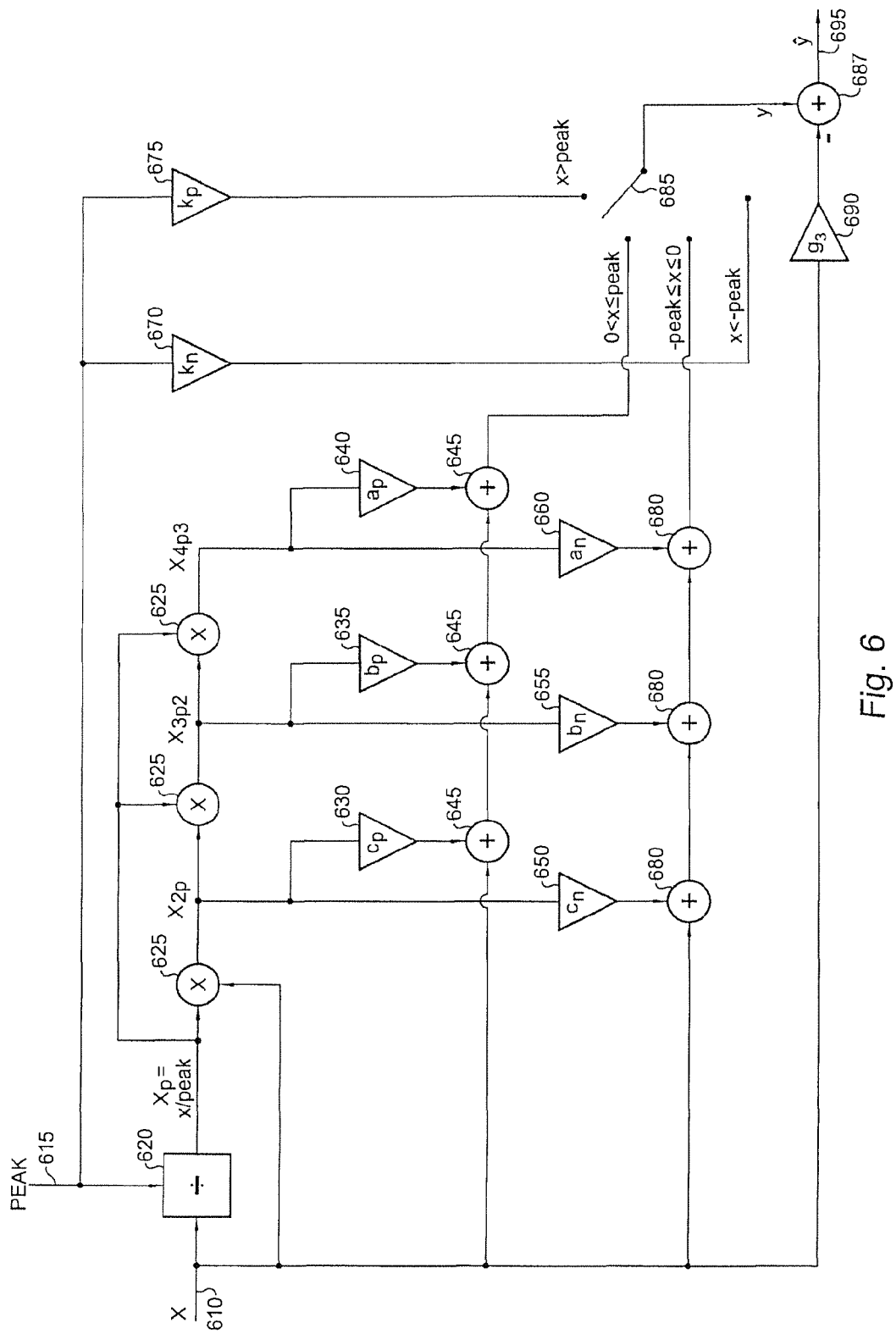
FIG. 6 is a high-level circuit diagram of an asymmetric polynomial distortion function for bass signal enhancement, according to one embodiment of the present invention.

FIG. 6 is a functional schematic for a circuit implementation of asymmetric polynomial distortion function for psychoacoustic bass enhancement according to one embodiment of the present invention. As shown, an input signal x 610 is received and modified by the implementation of an asymmetric polynomial distortion function of the present invention resulting in an enhanced signal $\hat{y}$ 695.

The process begins with a received input signal x and a smoothed peak value 615. The smoothed peak level or normalization factor r is shown as "peak" 615 in FIG. 6. When x is greater than peak, x>peak, the normalization factor r is scaled by the positive soft-clipping coefficient $k_p$ 675 to yield signal $\hat{y}$ 685. Output signal y 685 is thereafter added 687 to a negatively scaled input signal $g_3 x$, $\hat{y}' = y - g_3 x$. The scaled input signal is the combination of the input signal x 610 and a gain, $g_3$ 690. When x is greater than r the enhanced output signal $\hat{y}$ 695 is a combination 687 of the scaled input signal $g_3 x$ and the normalized positive soft-clipping coefficient $rk_p$.

Similarly, when x is less than peak, x<peak, the normalization factor r is scaled by the negative soft-clipping coefficient $k_n$ 670 to yield signal y 685. Output signal y 685 is thereafter added 687 to the negatively scaled input signal $-g_3 x$. When x is less than r the enhanced output signal $\hat{y}$ 695 is an additive combination 687 of the scaled input signal $-g_3 x$ and the normalized negative soft-clipping coefficient $rk_p$.

When the input signal x is greater than zero but less than or equal to the normalization factor r, 0<x≤peak, the input signal x 610 is combined with a set of coefficients to yield an output signal y 685. As shown, input signal x 610 is multiplied by $x_p$-, yielding $x_{2p}$, wherein $x_p$ is the input signal x 610 divided 620 by the normalization factor, r (peak). Thereafter $x_{2p}$ is combined with positive coefficient $c_p$ 630 yielding $c_p x_{2p}$. In a similar manner the input signal x and the normalized input signal $x_p$ are multiplicatively combined 625 to yield $x_{3p2}$ and $x_{4p3}$. Likewise $x_{3p2}$ is combined with positive coefficient $b_p$ 635 and $x_{4p3}$ is combined with positive coefficient $a_p$ 640 yielding $b_p x_{3p2}$ and $a_p x_{4p3}$ respectively. Each of these factors, $a_p x_{4p3}$, $b_p x_{3p2}$ and $c_p x_{2p}$ is combined additively 645 with input signal x 610 yielding output signal y 685. Output signal y 685 is additively 687 combined with the scaled input signal $-g_3 x$ to arrive at the enhanced output signal $\hat{y}$ 695.

When the input signal x is less than or equal to zero but greater than or equal to the negative of the normalization factor r, -peak≤y≤0, the input signal x 610 is combined with another set of coefficients to yield an output signal y 685. Input signal x 610 is again multiplied by $x_p$ yielding $x_{2p}$. Thereafter $x_{2r}$ is combined with negative coefficient $c_n$ 650 yielding $c_n x_{2p}$. In a similar manner, the input signal x 610 and a normalized input signal $x_p$ are multiplicatively combined 625 to yield $x_{3p2}$ and $x_{4p3}$. Likewise, $x_{3p2}$ is combined with negative coefficient $b_n$ 655 and $x_{4p3}$ is combined with negative coefficient $a_n$ 660 yielding $b_n x_{3p2}$ and $a_n x_{4p3}$ respectively. Each of these factors, $a_n x_{4p3}$, $b_n x_{3p2}$ and $c_n x_{2p}$ is combined additively 680 with input signal x 610 yielding output signal y 685. Output signal y 685 is additively 687 combined with the scaled input signal $-g_3 x$ to arrive at the enhanced output signal $\hat{y}$ 695.

Figure 7:
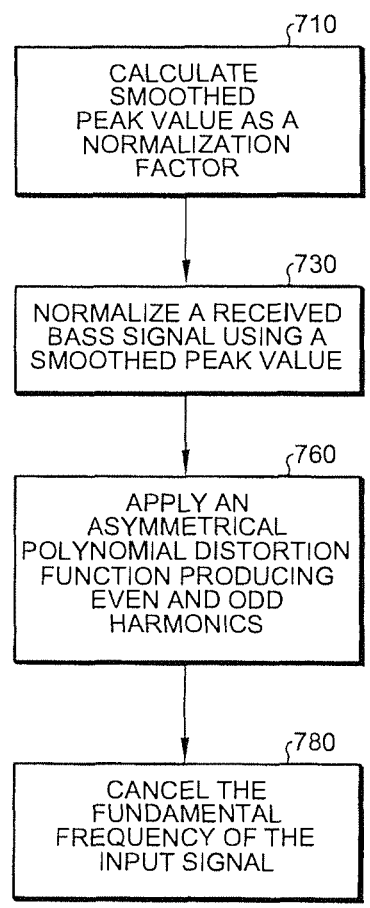
FIG. 7 is a flowchart showing one method embodiment for a process of psychoacoustic bass signal enhancement using an asymmetric polynomial distortion function, according to the present invention.

FIG. 7 is a flowchart showing one method embodiment for a process of psychoacoustic bass signal enhancement using an asymmetric polynomial distortion function according to the present invention. The determination of a psychoacoustic enhanced bass signal using an asymmetric polynomial distortion function begins with calculating 710 a smoothed peak value as a normalization factor. Using this calculated smoothed peak value a bass signal is normalized 730 so that approximately the same harmonic content is generated by loud notes as by soft and decaying notes. Such normalization reduces the occurrence that soft bass notes would be inaudible because their amplitudes are in the approximately-linear range. In such a situation no significant harmonics would be generated.

With the input signal normalized, an asymmetric polynomial distortion function, according to one embodiment of the present invention and as described herein, can be applied 760. By doing so even and odd harmonics of the normalized input signal are generated. Having produced a plurality of odd and even harmonics, a portion of the input signal is subtracted to cancel 780 some of the energy at the fundamental frequency and minimize the chance that such a signal would overload the speakers and possibly cause cone damage.

FIG. 7 illustrates a method for psychoacoustic bass signal enhancement using an asymmetric polynomial distortion function. Using the asymmetric polynomial distortion function as described herein, and with the stated constraints, produces a pleasant and realistic auditory experience even though the fundamental bass frequency is absent.

In a preferred embodiment, one or more portions of the present invention can be implemented in software, hardware or firmware. When a portion of the present invention is embodied as software, the programming code which embodies the present invention is typically accessed by a microprocessor from long-term, persistent storage media of some type, such as a flash drive or hard drive. The software programming code may be embodied on any of a variety of known media for use with a data processing system, such as a diskette, hard drive, or CD-ROM. The code may be distributed on such media, or may be distributed from the memory or storage of one computer system over a network of some type to other computer systems for use by such other systems. Alternatively, the programming code may be embodied in the memory of the device and accessed by a microprocessor using an internal bus. The techniques and methods for embodying software programming code in memory, on physical media, and/or distributing software code via networks are well known and will not be further discussed herein.

Generally, program modules include routines, programs, objects, components, data structures and the like that perform particular tasks or implement particular abstract data types. Moreover, those skilled in the art will appreciate that one or more portions of the invention can be practiced with other computer system configurations, including hand-held devices, multi-processor systems, microprocessor-based or programmable consumer electronics, network PCs, minicomputers, mainframe computers and the like. The invention may also be practiced in distributed computing environments where tasks are performed by remote processing devices that are linked through a communications network. In a distributed computing environment, program modules may be located in both local and remote memory storage devices.

An exemplary system for implementing the invention includes a general purpose computing device in the form of a conventional personal computer, a personal communication device or the like, including a processing unit, a system memory, and a system bus that couples various system components including the system memory to the processing unit. The system bus may be any of several types of bus structures including a memory bus or memory controller, a peripheral bus, and a local bus using any of a variety of bus architectures. The system memory generally includes read-only memory (ROM) and random access memory (RAM). A basic input/output system (BIOS) containing the basic routines that help to transfer information between elements within the personal computer, such as during start-up, is stored in ROM. The personal computer may further include a hard disk drive for reading from and writing to a hard disk, a magnetic disk drive for reading from or writing to a removable magnetic disk. The hard disk drive and magnetic disk drive are connected to the system bus by a hard disk drive interface and a magnetic disk drive interface respectively. The drives and their associated computer-readable media provide non-volatile storage of computer readable instructions, data structures, program modules and other data for the personal computer. Although the exemplary environment described herein employs a hard disk and a removable magnetic disk, it should be appreciated by those skilled in the art that other types of computer readable media which can store data that is accessible by a computer, such as magnetic cassettes, flash memory cards, digital video disks, random access memories (RAMs), read-only memories (ROMs) and the like may also be used in the exemplary operating environment.

A number of program modules embodying the present invention may be stored on the hard disk, magnetic disk, ROM or RAM, including an operating system, one or more application programs or software portions, other program modules and program data. A user may enter commands and information into the personal computer through input devices such as a keyboard and pointing device. Other input devices may include a microphone, joystick, game pad, satellite dish, scanner or the like. These and other input devices are often connected to the processing unit through a serial port interface that is coupled to the system bus, but may be connected by other interfaces, such as a parallel port, game port or universal serial bus (USB). A monitor or other type of display device may also be connected to the system bus via an interface, such as a video adapter.

As will be understood by those familiar with the art, the invention may be embodied in other specific forms without departing from the spirit or essential characteristics thereof. Likewise, the particular naming and division of the modules, managers, functions, systems, engines, layers, features, attributes, methodologies, and other aspects are not mandatory or significant, and the mechanisms that implement the invention or its features may have different names, divisions, and/or formats. Furthermore, as will be apparent to one of ordinary skill in the relevant art, the modules, managers, functions, systems, engines, layers, features, attributes, methodologies, and other aspects of the invention can be implemented as software, hardware, firmware, or any combination of the three. Additionally, the present invention is in no way limited to implementation in any specific programming language, or for any specific operating system or environment. Accordingly, the disclosure of the present invention is intended to be illustrative, but not limiting.

It is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features that are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The Applicant hereby reserves the right to formulate new claims to such features and/or combinations of such features during the prosecution of the present application or of any further application derived therefrom.

I claim:

1. A method for enhancing an audio signal, the method comprising:
    receiving a bass audio signal having a fundamental frequency;
    normalizing an amplitude of the bass audio signal to generate a normalized bass audio signal;
    producing a plurality of harmonics of the normalized bass audio signal using a monotonic, asymmetric fourth order polynomial distortion function;
    attenuating the bass audio signal to produce an attenuated bass audio signal; and
    subtracting the attenuated bass audio signal from said plurality of harmonics generated by the monotonic, asymmetric polynomial distortion function to reduce energy at a fundamental frequency.

2. The method of claim 1 wherein the monotonic, asymmetric polynomial distortion function has continuous first and second derivatives.

3. The method of claim 1 wherein the monotonic, asymmetric polynomial distortion function produces even and odd harmonics in response to a sinusoidal input.

4. The method of claim 1 wherein the monotonic, asymmetric polynomial distortion function limits output amplitude.

5. The method of claim 1 wherein responsive to the bass audio signal having a magnitude greater than or equal to 1, limiting output $f(x)$ of the monotonic, asymmetric polynomial distortion function to a positive clipping level, $k_p$, and a negative clipping level, $k_n$, such that $$f(x) = \begin{cases} k_p, & x \geq 1 \\ k_n, & x \leq -1 \end{cases},$$

wherein $k_p$ and $k_n$ are constrained such that $0<k_p<1$ and $-1<k_n<0$.

6. The method of claim 5 such that $f(1)=k_p$ and $f(-1)=k_n$.

7. The method of claim 6 wherein magnitudes of the positive clipping level $k_p$ and the negative clipping level $k_n$ are unequal, $|k_p| \neq |k_n|$.

8. The method of claim 1 wherein the monotonic, asymmetric polynomial distortion function comprises a pair of fourth-order polynomials.

9. The method of claim 1 wherein the monotonic, asymmetric polynomial distortion function can be represented as $$f(x) = \begin{cases} k_p, & x \geq 1 \\ a_p x^4 + b_p x^3 + c_p x^2 + x, & 0 \leq x < 1 \\ a_n x^4 + b_n x^3 + c_n x^2 + x, & -1 < x < 0 \\ k_n, & x \leq -1 \end{cases}.$$

10. The method of claim 1 wherein responsive to producing the plurality of harmonics, compensating for normalizing the signal.

11. The method of claim 1 wherein the monotonic, asymmetric polynomial distortion function is constrained to pass through the origin, $f(0)=0$.

12. The method of claim 11 wherein the monotonic, asymmetric polynomial distortion function is constrained to have a slope of unity as it passes through the origin, such that $f'(0)=1$.

13. The method of claim 1 wherein responsive to a unity magnitude input, a second derivative of the monotonic, asymmetric polynomial distortion function is substantially zero, $$f'(1) = 0,$$
$$f'(-1) = 0.$$

14. The method of claim 1 wherein the monotonic, asymmetric polynomial distortion function is constrained to have a slope substantially equal to zero at maximum input levels, $x=\pm 1$, $$f'(1) = 0, f'(-1) = 0.$$

15. A computer system for enhancing an audio signal, the computer system comprising:
   a machine capable of executing instructions embodied as software; and
   a plurality of software portions, wherein
      one of said software portions is configured to receive a bass audio signal, the bass audio signal having an amplitude;
      one of said software portions is configured to normalize the amplitude of the bass audio signal to produce a normalized bass audio signal;
      one of said software portions is configured to produce a plurality of even and odd harmonics from the normalized bass audio signal using a monotonic, asymmetric fourth order polynomial distortion function;
      one of said software portions is configured to generate an attenuated bass audio signal from the bass audio signal; and
      one of said software portions configured to subtracted the attenuated bass audio signal from the plurality of even and odd harmonics produced by the monotonic, asymmetric fourth order polynomial distortion function.

16. A method for enhancing an audio signal, the method comprising:
   receiving a bass audio signal having a fundamental frequency;
   normalizing an amplitude of the bass audio signal to generate a normalized bass audio signal;
   producing a plurality of harmonics of the normalized bass audio signal using a monotonic, asymmetric fourth order polynomial distortion function; and
   responsive to the bass audio signal having a magnitude greater than or equal to 1, limiting output $f(x)$ of the monotonic, asymmetric polynomial distortion function to a positive clipping level, $k_p$, and a negative clipping level, $k_n$, such that $$f(x) = \begin{cases} k_p, x \geq 1 \\ k_n, x \leq -1 \end{cases},$$

wherein $k_p$ and $k_n$, are constrained such that $0<k_p<1$ and $-1<k_n<0$.

17. The method of claim 16 such that $f(1)=k_p$ and $f(-1)=k_n$.

18. The method of claim 17, wherein magnitudes of the positive clipping level $k_p$ and the negative clipping level $k_n$ are unequal, $|k_p|\neq|k_n|$.

19. A method for enhancing an audio signal, the method comprising:
   receiving a bass audio signal having a fundamental frequency;
   normalizing an amplitude of the bass audio signal to generate a normalized bass audio signal;
   producing a plurality of harmonics of the normalized bass audio signal using a monotonic, asymmetric fourth order polynomial distortion function;
   wherein the monotonic, asymmetric polynomial distortion function is constrained to have a slope substantially equal to zero at maximum input levels, $x=\pm 1$, $$f'(1) = 0, f'(-1) = 0.$$

* * * * *